United States Patent
Ito

(10) Patent No.: US 8,299,397 B2
(45) Date of Patent: Oct. 30, 2012

(54) LASER DICING APPARATUS AND DICING METHOD

(75) Inventor: Ryosuke Ito, Hachioji (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 313 days.

(21) Appl. No.: 12/809,352

(22) PCT Filed: Nov. 10, 2008

(86) PCT No.: PCT/JP2008/070406
§ 371 (c)(1),
(2), (4) Date: Jun. 18, 2010

(87) PCT Pub. No.: WO2009/078231
PCT Pub. Date: Jun. 25, 2009

(65) Prior Publication Data
US 2011/0163079 A1 Jul. 7, 2011

(30) Foreign Application Priority Data
Dec. 19, 2007 (JP) .................... 2007-327249

(51) Int. Cl.
*B23K 26/00* (2006.01)
(52) U.S. Cl. ............... 219/121.72; 219/121.67
(58) Field of Classification Search ............ 219/121.72, 219/121.67
See application file for complete search history.

(56) References Cited

U.S. PATENT DOCUMENTS

| 6,902,990 B2 * | 6/2005 | Gottfried et al. ............ 438/463 |
| 7,745,311 B2 * | 6/2010 | Hoshino et al. ............. 438/463 |
| 2006/0092990 A1 | 5/2006 | Koga et al. |
| 2006/0124617 A1 * | 6/2006 | Hsu ........................ 219/121.67 |
| 2008/0220590 A1 * | 9/2008 | Miller et al. ................ 438/463 |
| 2009/0153868 A1 * | 6/2009 | Sawabe et al. .............. 356/445 |

FOREIGN PATENT DOCUMENTS

| JP | 2005-175147 A | 6/2005 |
| JP | 2006-122982 A | 5/2006 |

OTHER PUBLICATIONS

International Preliminary Report on Patentability (Chapter I) with English translation.

\* cited by examiner

*Primary Examiner* — Roy Potter
(74) *Attorney, Agent, or Firm* — Birch, Stewart, Kolasch & Birch, LLP

(57) ABSTRACT

Performing a high precision dicing without being affected by a step on a wafer surface, and preventing a particle generation caused by ablation is enabled. A laser dicing apparatus (10), which forms a reformed layer in a wafer (W) by irradiating the wafer (W) with a laser beam, includes: a condensing lens (26) that condenses the laser beam; an astigmatic optical measuring section (29) that measures an unevenness of a surface of the wafer (W) based on the laser beam radiated by a laser oscillating apparatus (21); an actuator (27) that moves the condensing lens (26) to adjust the position of the condensing point of the laser beam; and a control section (50) that controls the actuator (27). The control section (50) switches between a control based on the unevenness measured by the astigmatic optical measuring section (29) and a control for maintaining the position of the condensing lens (26) constant, in accordance with the position of the laser beam.

4 Claims, 7 Drawing Sheets

RELATED ART ical field

LASER DICING APPARATUS AND DICING METHOD

TECHNICAL FIELD

The present invention relates to a laser dicing apparatus and a dicing method for dividing a wafer for semiconductor devices, electronic components and the like into individual chips.

BACKGROUND ART

As means for solving the problem of chipping in a dicing process, there is proposed a technology relating to a laser dicing apparatus which launches a laser beam whose condensing point is adjusted to be inside of a wafer, and forms a reformed region due to multi-photon absorption inside the wafer to divide it into individual chips, in place of a conventional cutting by a dicing blade (see, for example, Patent Document 1).

In the laser dicing apparatus as described in Patent Document 1, in order to form a reformed region, which is to be formed inside a wafer, at a fixed depth from the wafer surface, it is necessary to detect the position (height) of the wafer surface and control the position of the condensing point of a laser beam at a high precision.

Therefore, in a conventional laser dicing apparatus, the position of the condensing point of a laser beam is controlled by an autofocus mechanism. To be specific, as illustrated in FIG. 7, a laser beam L1 is radiated from a laser oscillating apparatus 21 toward a wafer. Part of the radiated laser beam L1 becomes incident to the inside of the wafer and is condensed at a certain position (condensing point) forming a reformed region P. The reformed region P formed by the laser irradiation serves as a trigger for the singulation of the wafer into chips. On the other hand, the laser beam L2 reflected by the wafer surface is taken into an optical measuring section 29 via a half mirror 22. The optical measuring section 29 detects an unevenness of the wafer surface based on the received laser beam L2. Then, based on the unevenness detected by the optical measuring section 29, a control section 50 controls a laser oscillating apparatus 21 (precisely, the position of a condensing lens that condenses the laser beam oscillated from the laser oscillating apparatus 21) so that the position of the condensing point of the laser beam in the wafer thickness direction is adjusted in real time for a scanning of the laser beam. Utilizing such an autofocus mechanism makes it possible to perform a high precision dicing that conforms to the unevenness of the wafer surface.

Patent Document 1: Japanese Patent Application Laid-Open No. 2005-175147

DISCLOSURE OF THE INVENTION

Problems to be Solved by the Invention

However, applying the above described autofocus mechanism over the entire surface of a wafer will result in following problems.

Although a wafer is generally made up of a smooth surface, there may exist a step of about several micrometers thereon. When an autofocus mechanism is applied to the periphery of such a step of several micrometers, the adjustment of the condensing point position cannot be performed at a sufficient precision in the step portion, resulting in a decline of dicing precision and a generation of particles due to ablation. This problem will be described by using FIG. 7.

An example of a typical step on a wafer surface which may cause a decline of dicing precision and a generation of particles includes a step 62 (see FIG. 7) formed by a protective film 60 provided in the outer periphery of the wafer. The protective film 60 in the outer periphery of the wafer is raised relative to the central part of the wafer, and a step 62 of about several micrometers exists. If an autofocus mechanism is applied to the periphery of such step 62 of several micrometers, the control by the control section 50 cannot conform to a steep surface displacement of the step 62 resulting in an overshooting. As a result, as illustrated in FIG. 7, the condensing point of the laser beam significantly fluctuates up and down, and a high precision dicing cannot be performed. Since this problem of overshooting affects the dicing precision in a wafer central part (a region where semiconductor devices are formed) where the protective film 60 is not formed, it may cause chip defects. Further, if a laser beam is condensed at the wafer surface due to fluctuations of the condensing point, particles caused by ablation will be generated thereby causing chip defects.

The present invention has been made in view of such circumstances, and has its object to provide a laser dicing apparatus and a dicing method which, even when a wafer having a step on its surface is to be diced, will not be affected by the step, and can perform a high precision dicing, preventing a generation of particles caused by ablation.

Means for Solving the Problems

To achieve the above described object, according to one aspect of the present invention, a laser dicing apparatus which forms a reformed region in a wafer by irradiating the wafer with a laser beam, includes: a laser beam radiating section that radiates the laser beam; a light condensing section that condenses the laser beam radiated from the laser beam radiating section; a surface information acquisition section that acquires unevenness information of the surface of the wafer based on the laser beam radiated by the laser beam radiating section; a condensing-point position adjustment section that adjusts a position of a condensing point of the laser beam by moving the light condensing section in a wafer thickness direction; a first control section that controls the condensing-point position adjustment section based on the unevenness information acquired by the surface information acquisition section; a second control section that controls the condensing-point position adjustment section so as to maintain the position of the light condensing section in the wafer thickness direction constant; a laser beam moving section that moves the laser beam relatively with respect to the wafer; and a control-section selecting section that selects either of the first control section and the second control section in accordance with the position of the laser beam on the wafer, the laser beam being moved by the laser beam moving section.

The laser dicing apparatus according to the present aspect switches the control section that controls the condensing-point position adjustment section between the first control section and the second control section in accordance with the position of the laser beam on the wafer. Therefore, when the laser beam is being scanned within the region on the wafer where there is no steep step, a precise adjustment of the condensing point position is performed based on the unevenness of the wafer surface detected in real time by the surface detection section, and in a region on the wafer where the possibility of the existence of a steep step is high, the laser beam is scanned with the position of the light condensing section being fixed, thereby enabling to prevent an overshooting due to the effect of a step. As a result, it is possible to prevent a decline of dicing precision and a generation of particles caused by ablation.

Moreover, it is preferable that the above described laser dicing apparatus further includes a region setting section that sets a region where the second control section is selected by the control-section selecting section.

According to this configuration, by setting a region which has a high possibility to include a steep step, at the region setting section prior to a laser processing (dicing), for the region, it is possible to scan the laser beam while the position of the light condensing section is fixed, and on one hand, for regions other than that, it is possible to precisely adjust the condensing point position based on the unevenness of the wafer surface detected by the surface detection section. As a result of this, even when a wafer having a step on its surface is to be diced, there will be no effect of the step, and dicing can be performed at a high precision over the entire surface of a wafer without generating particles caused by ablation.

The region set by the region setting section is preferably a region surrounded by a peripheral end part of the wafer and a substantially concentric circle located at a predetermined distance inwardly from the peripheral end part of the wafer.

In this case, there will be no effect of a step due to the protective film at the outer periphery of the wafer, which is provided in common wafers, and thus it is possible to perform dicing at a high precision over the entire surface of the wafer without generating particles caused by ablation.

Moreover, in order to achieve the above described object, according to a further aspect of the present invention, a dicing method of a wafer by use of a laser dicing apparatus including a laser beam radiating section that radiates a laser beam, a light condensing section that condenses the laser beam inside the wafer, and a laser beam moving section that moves the laser beam with respect to the wafer, includes: a surface information acquisition step of acquiring unevenness information of a surface of the wafer based on the laser beam radiated by the laser beam radiating section; an adjustment method selection step of selecting either method of a first adjustment method that adjusts a position of a condensing point of the laser beam based on the unevenness information acquired at the surface information acquisition step and a second adjustment method that maintains the position of the light condensing section in a wafer thickness direction constant, in accordance with a position of the laser beam on the wafer, the laser beam being moved by the laser beam moving section; and a condensing point position adjustment step of adjusting the position of the condensing point of the laser beam based on the method selected at the adjustment method selection step.

Advantages of the Invention

According to the present invention, even when a wafer having a step on its surface is to be diced, there will be no effect of the step, and a high precision dicing can be performed without generating particles caused by ablation.

DESCRIPTION OF SYMBOLS

Figure 1:
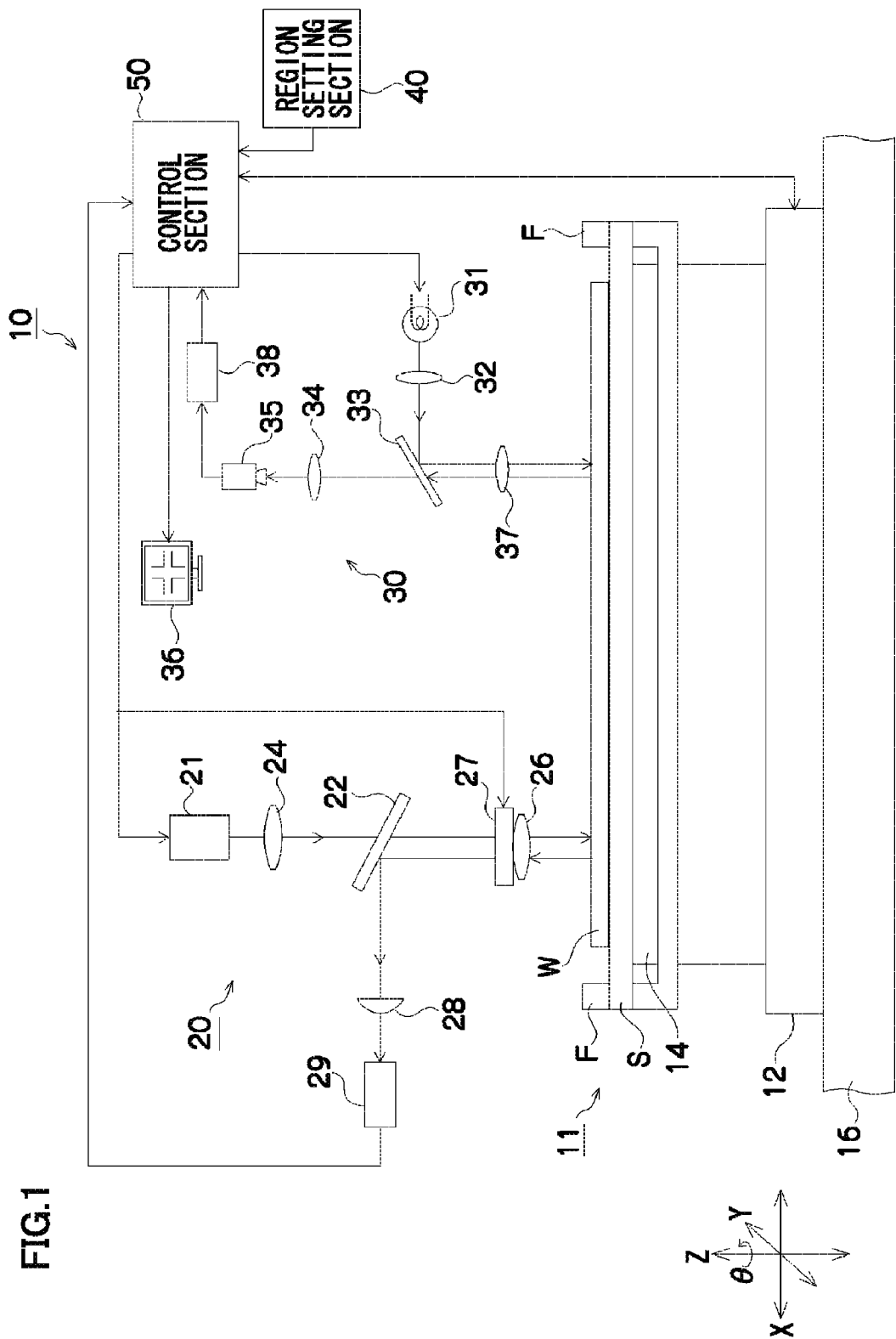
FIG. 1 is a schematic diagram which illustrates a configuration of a laser dicing apparatus which is an embodiment of the present invention.

10 Laser dicing apparatus
11 Wafer moving section
12 XYZθ table
14 Adsorption stage
20 Laser optics section
21 Laser oscillating apparatus
22 Half mirror
24 Collimating lens
26 Condensing lens
27 Actuator
28 Cylindrical lens
29 Astigmatic optical measuring section
29A Quadrant photodiode
30 Observation optics section
31 Observation light source
32 Collimating lens
33 Half mirror
34 Condensing lens
35 CCD camera
36 Television monitor
38 Image processing apparatus
40 Region setting section
50 Control section
60 Protective film
62 Step

BEST MODE FOR CARRYING OUT THE INVENTION

Hereafter, preferred embodiments of the laser dicing apparatus and dicing method relating to the present invention will be described in detail according to the appended drawings. It is noted that like components are given like reference numerals or characters in each drawing.

[Outline Configuration of Laser Dicing Apparatus]

An outline configuration of a laser dicing apparatus which is an embodiment of the present invention will be described.

Figure 2:
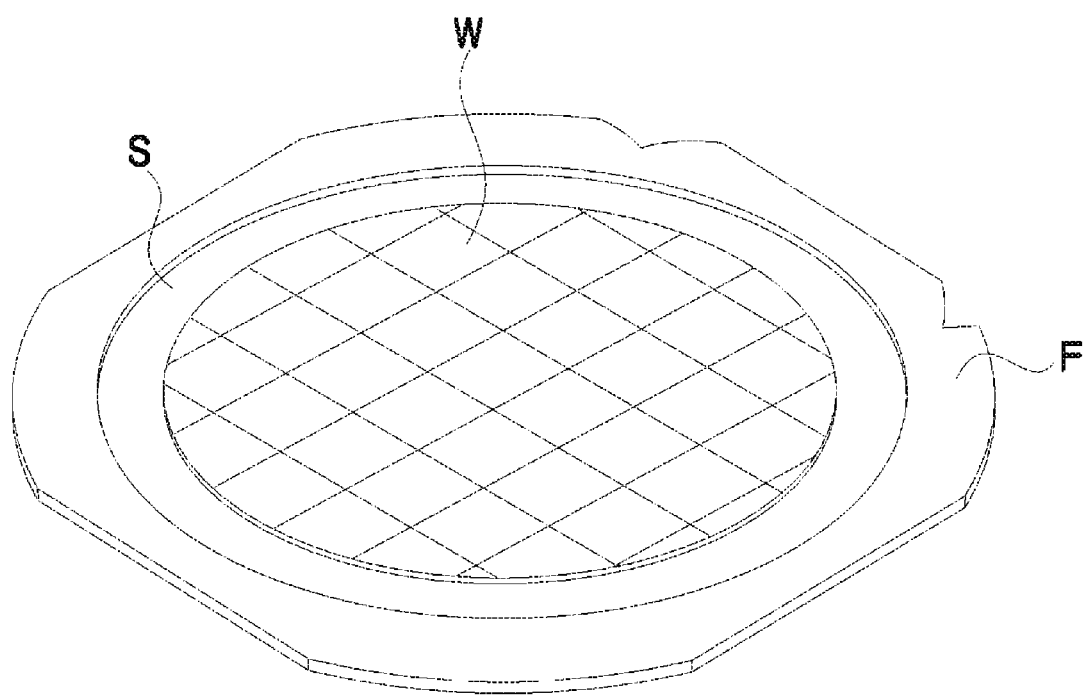
FIG. 2 is a perspective view which illustrates an appearance of a wafer to be transported into the laser dicing apparatus relating to the present embodiment.

FIG. 1 is an outline configuration diagram of a laser dicing apparatus relating to the present embodiment. FIG. 2 is a schematic diagram to show the appearance of a wafer to be transported into a dicing apparatus 10 illustrated in FIG. 1. As illustrated in FIG. 2, a wafer W to be transported into the dicing apparatus 10 is attached to a dicing sheet S having an adhesive on one surface thereof, and is integrated with a frame F via the dicing sheet S.

The laser dicing apparatus 10 is made up of, as illustrated in FIG. 1, a wafer moving section 11, a laser optics section 20, an observation optics section 30, a control section 50, and the like.

The wafer moving section 11 is made up of an XYZθ table 12 which is provided on a main base 16 of the laser dicing apparatus 10, an adsorption stage 14 that adsorbs and retains a wafer, and the like. The adsorption stage 14, which is placed on the XYZθ table 12, adsorbs and retains the wafer W mounted to the frame F via the dicing sheet S. The wafer W is moved at a high precision in the XYZθ directions of FIG. 1 by the wafer moving section 11 having a configuration as described above. It is noted that in the present embodiment, a laser beam is scanned on a wafer by moving the XYZθ table 12 with respect to the laser oscillating apparatus 21 described below. In this way, in the present embodiment, the XYZθ table 12 is moved with respect to the laser oscillating apparatus 21 as one aspect of the "laser beam moving section". In addition to that, the laser beam moving section may be an aspect which moves the laser oscillating apparatus 21, and an aspect which moves both of the XYZθ table 12 and the laser oscillating apparatus 21.

The laser optics section 20 is made up of a laser oscillating apparatus (corresponding to the "laser beam radiating section") 21 that oscillates a laser beam; a collimating lens 24 that collimates the oscillated laser beam into a parallel beam; a condensing lens (corresponding to the "light condensing section") 26 that condenses the laser beam; an actuator (corresponding to the "condensing-point position adjustment section") 27 that causes the condensing lens 26 to minutely move on the optical axis; a half mirror 22 that takes out the laser beam reflected by the wafer surface to a below described astigmatic optical measuring section (corresponding to the "surface detection section") 29; a cylindrical lens 28 that condenses the laser beam taken out by the half mirror 22, and the like.

In the laser optics section 20, the laser beam oscillated from the laser oscillating apparatus 21 is condensed at the inside of the wafer W via optical systems such as the collimating lens 24, the half mirror 22, the condensing lens 26, and the like. The position of the condensing point in the Z direction is adjusted by the actuator 27 causing the condensing lens 26 to minutely move in the Z direction.

In the present embodiment, a piezoelectric element is used as the actuator 27. This piezoelectric element has a hollow cylindrical shape, its upper end being fixed to the main body of the laser optics section 20 and its lower end being bonded with a lens frame that retains the condensing lens 26. Upon application of a voltage, the piezoelectric element expands/contracts, and the condensing lens 26 minutely moves in the optical axis direction in accordance with the expansion/contraction of the piezoelectric element.

Figure 3A:
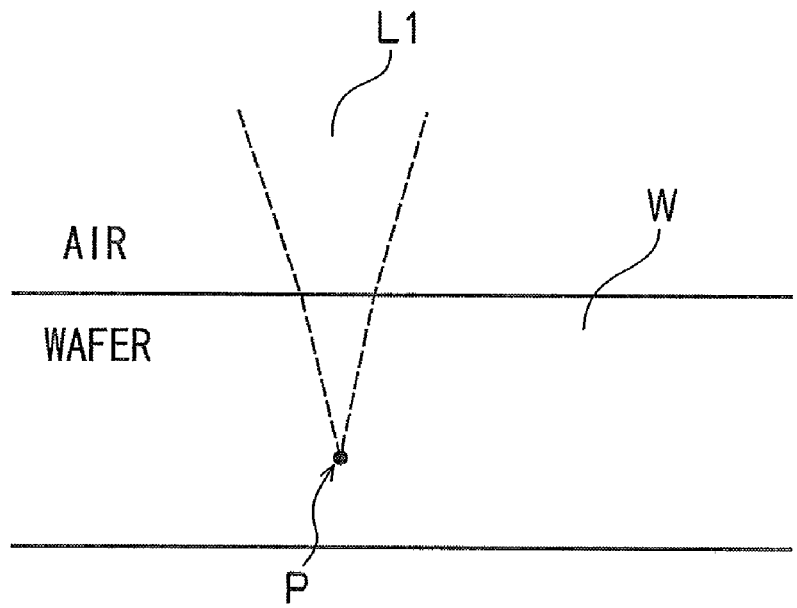
FIG. 3A is a (first) conceptual diagram which represents a reformed layer formed inside a wafer.
Figure 3B:
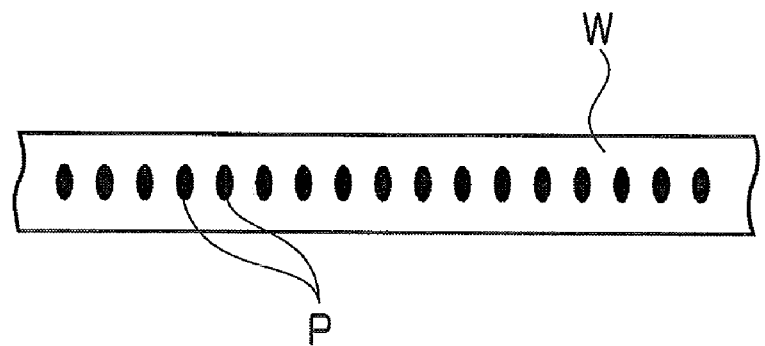
FIG. 3B is a (second) conceptual diagram which represents a reformed layer formed inside a wafer.

Now, a reformed region which is formed inside a wafer by a laser beam oscillated from the laser oscillating apparatus 21 will be described. As the laser beam oscillated from the laser oscillating apparatus 21, for example, a laser beam which has a pulse width of not more than 1 μs and a peak power density at the condensing point of $1 \times 10^8$ (W/cm$^2$) or more may be used. FIGS. 3A and 3B are conceptual diagrams which illustrates a reformed region which is formed in the vicinity of a condensing point inside a wafer. FIG. 3A illustrates a state in which a processing laser beam L1 incident to the inside of the wafer W has formed a reformed region P at a condensing point, and FIG. 3B diagrammatically illustrates a state in which a pulse-type processing laser beam L1 is scanned in parallel with the surface of the wafer W so that a plurality of discontinuous reformed regions P are formed in line in its inside. As illustrated in FIG. 3A, part of the laser beam L1 from the laser optics section 20 becomes incident to the wafer W causing an energy concentration in the vicinity of the condensing point so that a reformed region P due to multi-photon absorption, such as a crack region, a melting region, a refractive-index change region, and the like is formed. Since the laser beam L1 is refracted upon incidence from air to the wafer, the depth (the position of a condensing point in the wafer thickness direction) at which a reformed region P is formed is dependent on the difference in refractive index between air and the wafer. As illustrated in FIG. 3B, a wafer is irradiated by a pulse-type processing laser beam L1 to form a plurality of reformed regions P along a dicing street so that the balance of intermolecular force is collapsed and thus the wafer W is split spontaneously or by being applied with a slight outer force.

The observation optics section 30 includes an observation light source 31, a collimating lens 32, a half mirror 33, condensing lenses 34 and 37, a CCD camera 35 as an observation apparatus, an image processing apparatus 38, a TV monitor 36, and the like.

In the observation optics section 30, an illuminating light emitted at the observation light source 31 reaches the surface of the wafer W via optical systems such as a collimating lens 32, a half mirror 33, a condensing lens 37, and the like. The reflected light from the surface of the wafer W becomes incident to the CCD camera 35 as an observation apparatus via the condensing lens 37, the half mirror 33, and the condensing lens 34 so that a surface image of the wafer W is picked up.

This image pickup data is subjected to an image processing at an image processing apparatus 38 and is inputted to a control section 50. Based on the image pickup data, the XYZθ table 12 is moved under a control by the control section 50 so that an alignment of the wafer W is performed. Moreover, the image pickup data is displayed on a TV monitor 36 through the control section 50.

The control section 50 is made up of a CPU, a memory, an input/output circuit, and the like, and controls each part of the laser dicing apparatus 10 such as a wafer moving section 11, a laser optics section 20, an observation optics section 30, and the like. For example, the control section 50 controls an actuator 27 in order to adjust the position of the condensing point of a laser beam in the wafer thickness direction. That is, the control section 50 functions as a "first control section" that controls the actuator 27 based on the unevenness of the wafer detected by an astigmatic optical measuring section 29, and a "second control section" that controls the actuator 27 so as to maintain the position of the condensing lens 26 in the wafer thickness direction constant with respect to the adsorption stage 14. Moreover, the control section 50 functions as a "control-section selecting section" that selects one of the first control section and the second control section as the control section for controlling the actuator 27. Details of the control section 50 will be described below.

It is preferable that the laser dicing apparatus 10 includes a region setting section 40 that sets a region on a wafer where the second control section controls the actuator 27, and the control section 50 that functions as the control-section selecting section selects the second control section to control the actuator 27 when the laser beam is scanned within the region on the wafer set by the region setting section 40.

An example of the region setting section 40 includes a user interface by which a user that uses the laser dicing apparatus can input a region where the possibility of including a steep step is high.

Providing the region setting section 40 in this way makes it possible to preset a region where the possibility of including a steep step is high, prior to a laser processing (dicing). Further, it is possible to use the second control section thereby maintaining the position of the condensing lens 26 in the wafer thickness direction constant with respect to the adsorption stage 14 for a region which is set by the region setting section 40, and for the regions other than that, it is possible to use the first control section thereby performing a precise adjustment of the condensing point position based on the unevenness of the wafer surface detected by the astigmatic optical measuring section 29. As a result, even when a wafer having a step in the surface thereof is diced, there will be no effect of the step, and dicing can be performed at a high precision over the entire surface of the wafer without generating particles caused by ablation.

The region on a wafer which is set by the region setting section 40 may be a partial region on the wafer or the entire surface of the wafer. For example, when the unevenness of the wafer to be used is negligibly small and there is no need of using an autofocus function, it is preferable that the entire surface of the wafer is set as the region on the wafer where the adjustment of the condensing point position by use of the second control section is performed. When the entire surface of the wafer is set as the region on the wafer where the adjustment of the condensing point position by use of the second control section is performed, the condensing point position is adjusted over the entire surface of the wafer by using the second control section. Therefore, it is possible to omit a real time unevenness detection (an unevenness detection of wafer surface by use of the astigmatic optical measuring section 29) which is required for adjusting the condensing point position by use of the first control section, thereby substantially reducing the time required for dicing.

Further, the region of the wafer that is set by the region setting section 40 is preferably a region surrounded by the peripheral end part of the wafer and a substantially concentric circle which is located at a predetermined distance inwardly from the peripheral end part of the wafer.

According to this aspect, there will be no effect of a step 62 due to a protective film 60 at the outer periphery of the wafer, which is provided for a common wafer, and dicing can be performed at a high precision over the entire surface of the wafer without generating particles caused by ablation. Moreover, the number of the parameter required to set a region is one (only the distance from the peripheral end part of the wafer) and thus the region setting by use of the region setting section 40 can be simplified.

The dicing apparatus 10 includes, in addition to those described above, a wafer cassette elevator, a wafer transporting section, an operation board, a indicator lamp, and the like, which are not illustrated.

The wafer cassette elevator moves a cassette, in which wafers are stored, up and down to place it at a transporting position. The transporting section transports wafers between the cassette and the adsorption stage 14.

The operation board is attached with switches for operating each part of the dicing apparatus 10 and a display apparatus. The indicator lamp indicates operational states of the dicing apparatus 10 such as an in-process, end-of-process, and emergency-stop states, and the like.

[First Control Section and Second Control Section]

Next, the first control section and the second control section included in the control section 50 will be described in detail.

In the present embodiment, the control section 50 includes a first control section that controls the actuator 27 based on the unevenness of the wafer detected by the astigmatic optical measuring section 29, and a second control section that controls the actuator 27 so as to maintain the position of the condensing lens 26 in the wafer thickness direction constant.

First, the control of the actuator 27 by the first control section will be described.

As illustrated in FIG. 1, a part of the laser beam which irradiates the surface of the wafer W is reflected by the surface of the wafer W, and passes through the cylindrical lens 28 via the condensing lens 26 and the half mirror 22 to be received by a quadrant photodiode 29A (illustrated in FIGS. 4A to 4C) of the astigmatic optical measuring section 29.

The signal outputted by the quadrant photodiode 29A is processed at the control section 50, and the position of the surface of the wafer W in the thickness direction (the unevenness of the wafer surface) is determined. Based on the determined position data of the surface of the wafer W in the thickness direction, the actuator 27 adjusts the position of the condensing point of the laser beam.

Figures 4A, 4B, 4C:
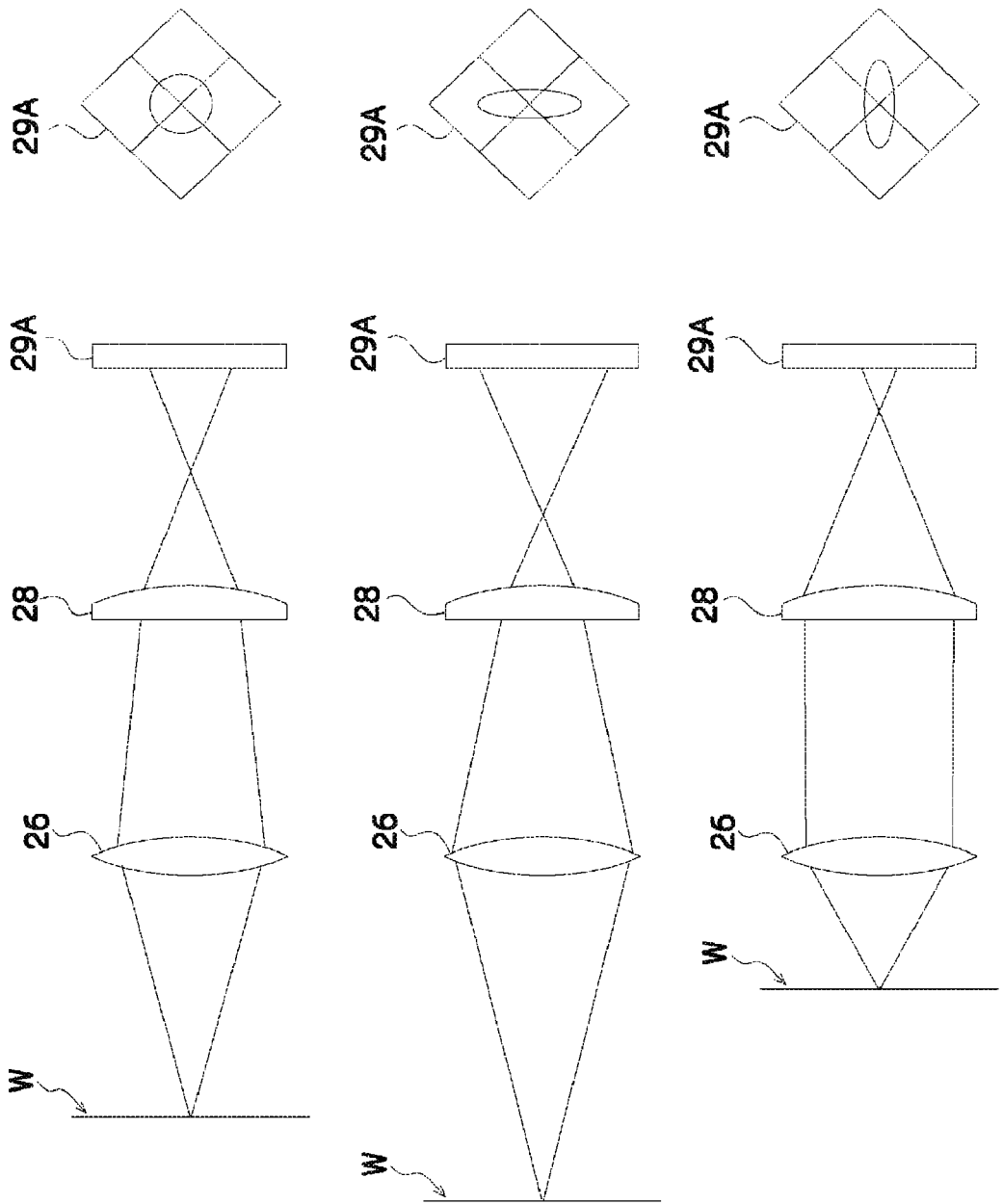
FIG. 4A is a (first) conceptual diagram which illustrates a relationship between a wafer surface-to-condensing lens distance and a cross-sectional shape of the laser beam received by a quadrant photodiode.
FIG. 4B is a (second) conceptual diagram which illustrates the relationship between a wafer surface-to-condensing lens distance and a cross-sectional shape of the laser beam received by a quadrant photodiode.
FIG. 4C is a (third) conceptual diagram which illustrates the relationship between a wafer surface-to-condensing lens distance and a cross-sectional shape of the laser beam received by a quadrant photodiode.

FIGS. 4A to 4C are conceptual diagrams which illustrate the measurement principle of the astigmatic optical measuring section 29. FIGS. 4A to 4C illustrate a situation from when a laser beam reflected from the wafer surface passes through a condensing lens 26 and a cylindrical lens 28, until it reaches the quadrant photodiode 29A of the astigmatic optical measuring section 29. In FIGS. 4A to 4C, for the sake of simplicity, the half mirror 22 illustrated in FIG. 1 is omitted.

FIG. 4A illustrates a situation in which the cross-sectional shape of the laser beam that has reached the quadrant photodiode 29A becomes a true circle. FIG. 4B illustrates a case in which the distance between the wafer surface and the condensing lens 26 becomes farther compared with the case of FIG. 4A. As seen from FIG. 4B, the cross-sectional shape of the laser beam received at the quadrant photodiode 29A is an ellipse stretched in a longitudinal direction. On the other hand, FIG. 4C illustrates a case in which the distance between the wafer surface and the condensing lens 26 becomes closer compared with the case of FIG. 4A. As seen from FIG. 4C, the cross-sectional shape of the laser beam received at the quadrant photodiode 29A is an ellipse stretched in a lateral direction. Thus, the cross-sectional shape of the laser beam received at the quadrant photodiode 29A varies depending on the distance between the wafer surface and the condensing lens 26. In the present embodiment, this characteristic is exploited to detect the unevenness of the wafer surface. That is, a received laser beam is photoelectrically converted at the quadrant photodiode 29A and is subjected to a calculation to detect the position of the wafer surface. What has been described so far is the detection method of the unevenness of the wafer surface utilizing an astigmatic method, which is adopted in the present embodiment. Although the present embodiment thus utilizes an astigmatic method as one aspect of the "surface detection section" that detects the unevenness of the wafer surface, it may be configured to use other known detection methods such as a knife-edge method and the like.

The unevenness of the wafer surface which has been detected as described above is fed to the control section 50 from the astigmatic optical measuring section 29. The first control section of the control section 50 controls the actuator 27 to vary the distance between the condensing lens 26 and the wafer surface based on the unevenness of the wafer surface detected at the astigmatic optical measuring section 29 thereby adjusting the position of the condensing point in the wafer thickness direction. When the first control section controls the actuator 27 in this way, a high precision dicing can be performed conforming to a minute unevenness of a wafer surface by adjusting the position of the condensing point based on the unevenness of the wafer surface which is detected in real time during laser processing.

On the other hand, the second control section of the control section 50 controls the actuator 27 so as to maintain the position of the condensing lens 26 in the wafer thickness direction constant with respect to the adsorption stage 14.

[Control-Section Selecting Section]

Next, the control section 50 as a control-section selecting section will be described.

The control section 50 determines which of the first control section and the second control section controls the actuator 27, based on the moving amount of the XYZθ table 12 in the XYZθ directions.

For example, when a region where the second control section controls the actuator 27 is set by the region setting section 40, and if the laser beam is being scanned within the region, the second control section controls the actuator 27 to maintain the position of the condensing lens 26 in the wafer thickness direction constant. On the other hand, if the laser beam is being scanned in other regions, the first control section controls the actuator 27.

[Operation of Laser Dicing Apparatus]

Next, dicing of the wafer W by use of the laser dicing apparatus 10 of the present embodiment will be described.

When the wafer W is diced, as illustrated in FIG. 2, it is mounted to a ring-like dicing frame F via a dicing tape S having an adhesive on one surface thereof and is transported in this state during a dicing process. Since the dicing tape S is thus bonded to the back face of the wafer W, even if the wafer W is separated into individual chips, the chips will not fall apart one by one.

The wafer W is adsorbed and retained to the adsorption stage 14 in this state. First, an image of a circuit pattern formed on the wafer surface is picked up by the CCD camera 35, and is subjected to an image processing by an image processing apparatus 38, and the XYZθ table 12 is moved under the control by the control section 50 so that alignments in the XY directions and θ direction are performed.

When the alignments are finished, the XYZθ table 12 moves in the XY directions and a processing laser beam is launched from the laser oscillating apparatus 21 along a dicing street of the wafer W. At the same time, a laser beam for surface detection which is reflected by the wafer surface is shifted in direction by the half mirror 22 to become incident to the astigmatic optical measuring section 29 so that the unevenness of the wafer surface is detected by the astigmatic optical measuring section 29.

The control section 50 determines which of the first control section and the second control section is to be selected as the control section that controls the actuator 27, based on the position of the laser beam on the wafer calculated based on the moving amount of the XYZθ table 12. That is, the control section 50 switches the adjustment method of the condensing point position between the first adjustment method that adjusts the position of the condensing point based on the unevenness of the wafer surface detected by the astigmatic optical measuring section 29 and a second adjustment method that maintains the position of the condensing lens 26 in the wafer thickness direction constant.

The control section (the first control section or the second control section) selected by the control section 50 controls the actuator 27 to adjust the position of the condensing lens 26 resulting in that the position of the condensing point of the laser beam is adjusted.

Figure 5:
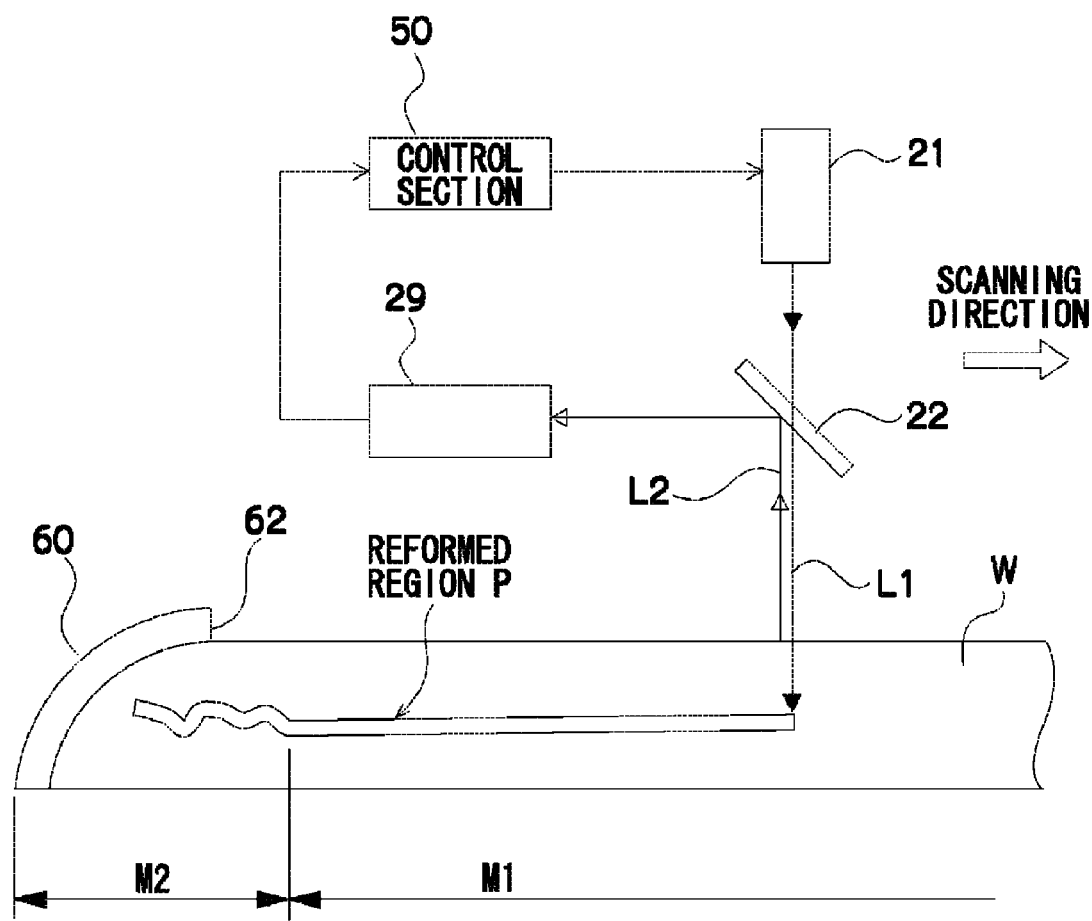
FIG. 5 is a schematic view which illustrates a manner in which a reformed region is formed inside a wafer by using the laser dicing apparatus relating to the present embodiment.

FIG. 5 is a conceptual diagram which illustrates the appearance of a reformed region P formed by the scanning of a laser beam. FIG. 5 illustrates, for the sake of simplicity, only the laser oscillating apparatus 21 and the half mirror 22 among the laser optics section 20. As illustrated in FIG. 5, when the laser beam is scanned from the left side toward the right side in the figure, a reformed region P is formed inside the wafer. When the laser beam is scanned within a region of the wafer W indicated by M2, the second control section included in the control section 50 is used to maintain the position of the condensing lens 26 in the wafer thickness direction constant with respect to the adsorption stage 14. On the other hand, when the laser beam is being scanned within a region of the wafer W indicated by M1, the first control section included in the control section 50 is used to control the position of the condensing point based on the unevenness of the wafer surface detected by the astigmatic optical measuring section 29.

Figure 7:
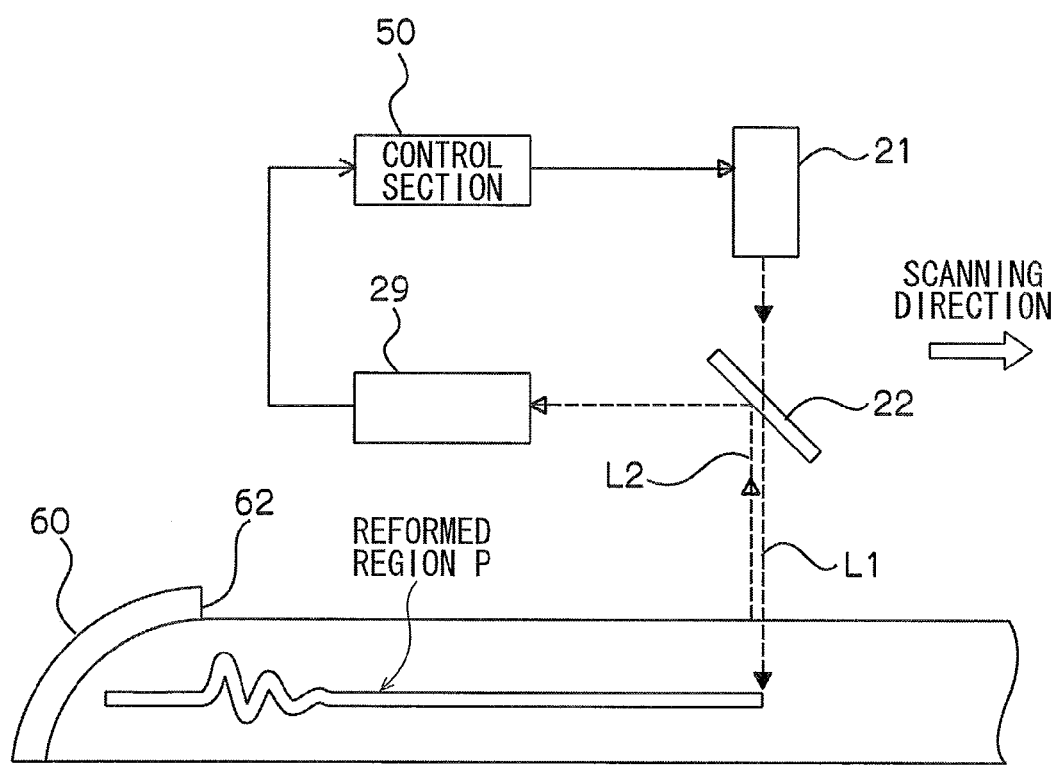
FIG. 7 is a schematic view which illustrates a manner in which a reformed region is formed inside a wafer by using a conventional laser dicing apparatus.

As illustrated in FIG. 5, using the laser dicing apparatus relating to the present embodiment will not lead to an overshooting illustrated in FIG. 7, and thus it is possible to prevent a decline of dicing precision and a generation of particles caused by ablation. It is noted that as illustrated in FIG. 5, although the depth at which the reformed region P is formed varies depending on the wafer thickness in a region where a protective film 60 is formed in the periphery of the wafer, chip defects will not be caused thereby. This is because in a region near the step 62, which is raised compared with the wafer central part, since the depth at which a reformed region P is formed becomes deeper (lower side of FIG. 5) from the surface of the wafer W due to the refractive-index difference between the protective film 60 and wafer W, and air, the condensing point of the laser beam becomes less likely to fall onto the surface of the protective film 60, and thus ablation is not likely to occur. Further, while an overshooting illustrated in FIG. 7 affects the wafer central part (a region of the wafer where semiconductor devices are formed) where a protective film 60 is not formed, the variation of the depth of the reformed region P when the laser dicing apparatus of the present variant is used is limited to a region (a region where semiconductor devices are not formed) where the protective film 60 is formed as illustrated in FIG. 5. Thus, the depth variation of the reformed region P as illustrated in FIG. 5 have little effect on the dicing precision at the wafer central part where semiconductor devices are formed, and therefore will not cause chip defects.

When, as described so far, a reformed region forming processing is performed for all the dicing streets in one direction of the wafer W, the XYZθ table 12 turns by 90° so that the reformed region forming processing is performed for all the orthogonal streets.

It is noted that although in the present embodiment, a laser dicing is performed by launching a processing laser beam from the front face side of the wafer W, this is not limiting and the processing laser beam may be launched from the rear face side of the wafer W. In this case, the processing laser beam will be launched into the wafer W penetrating through a dicing tape S, or the wafer W is bonded to the dicing tape S with the front face side facing downwardly. Moreover, in this case, it is necessary to observe the circuit pattern of the wafer surface by using a light beam which penetrates the wafer W, such as an infrared beam and the like, from the back face side thereby performing alignment.

[Variant of Laser Dicing Apparatus]

Next, a variant of the laser dicing apparatus 10 relating to the present embodiment will be described. The laser dicing apparatus relating to the present variant has the same configuration as that of the laser dicing apparatus 10 excepting that a storage section which prestores unevenness information relating to the wafer to be diced is included, and that the control section 50 includes a third control section in place of the second control section. Therefore, here, description on items overlapping those that have been already described on the laser dicing apparatus 10 will be omitted.

The storage section included in the laser dicing apparatus of the present variant prestores unevenness information relating to the wafer to be diced. For example, unevenness information of a wafer is stored, which is acquired in advance by a separate detection section separated from the laser dicing apparatus, and the like. Alternatively, unevenness information that is provided by the manufacture of the wafer to be diced may be stored. The unevenness information to be prestored in the storage section may be data to indicate the unevenness of the entire surface of a wafer, or data to indicate the unevenness of a partial region, such as a peripheral end part, of the wafer.

The control section 50 functions as the first control section that controls the actuator 27 based on the unevenness of a wafer, which is detected by the astigmatic optical measuring section 29, and the third control section that controls the actuator 27 based on the unevenness information of a wafer stored in the storage section. Moreover, the control section 50 functions as the control-section selecting section that determines to select one of the first control section and the third control section as the control section for controlling the actuator 27.

Figure 6:
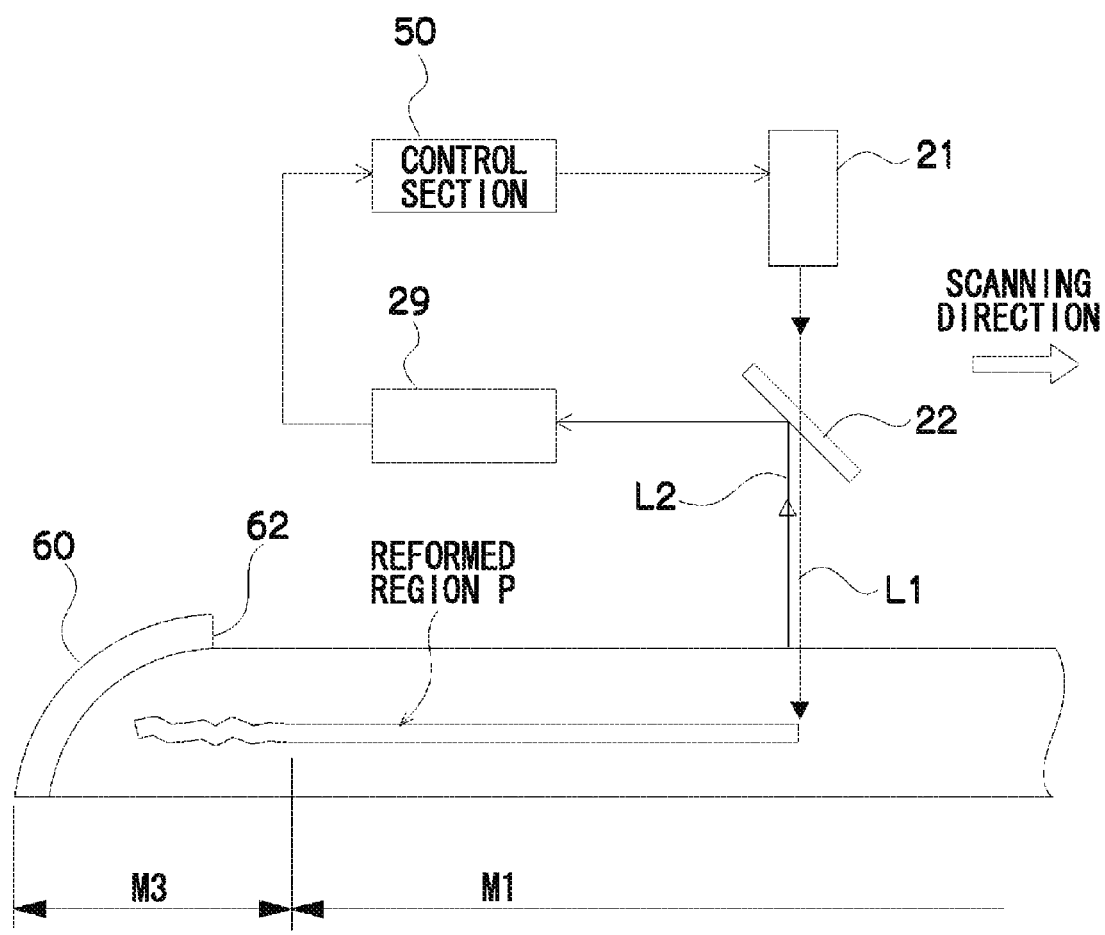
FIG. 6 is a schematic view which illustrates a manner in which a reformed region is formed inside a wafer by using a laser dicing apparatus relating to a variant of the present embodiment.

FIG. 6 is a conceptual diagram which illustrates the appearance of a reformed region P formed by using the laser dicing apparatus of the present variant. FIG. 6 illustrates, for the sake of simplicity, only a laser oscillating apparatus 21 and a half mirror 22 out of the laser optics section 20. As illustrated in FIG. 6, when the laser beam is scanned from the left side to the right side in the figure, a reformed region P is formed inside the wafer. When the laser beam is being scanned in the region indicated by M3 of the wafer W, a third control section included in the control section 50 is used to control the actuator 27 based on the unevenness information of the wafer stored in the storage section. On the other hand, the laser beam is being scanned in the region indicated by M1 of the wafer W, the first control section included in the control section 50 is used to adjust the position of the condensing point based on the unevenness of the wafer surface detected by the astigmatic optical measuring section 29.

As illustrated in FIG. 6, using the laser dicing apparatus relating to the present variant makes it possible to form a reformed region P at a substantially constant depth from the surface of the wafer W even in a peripheral end part where a protective film 60 is formed.

While the laser dicing apparatus and dicing method of the present invention have been described in detail so far, the present invention will not be limited to the examples described above, and various improvements and modifications can be made within the scope not departing from the essence of the present invention.

The invention claimed is:

1. A laser dicing apparatus which forms a reformed region in a wafer by irradiating the wafer with a laser beam, the laser dicing apparatus comprising:
   a laser beam radiating section that radiates the laser beam;
   a light condensing section that condenses the laser beam radiated from the laser beam radiating section;
   a surface information acquisition section that acquires unevenness information of the surface of the wafer based on the laser beam radiated by the laser beam radiating section;
   a condensing-point position adjustment section that adjusts the position of the condensing point of the laser beam by moving the light condensing section in a wafer thickness direction;
   a first control section that controls the condensing-point position adjustment section based on the unevenness information acquired by the surface information acquisition section;
   a second control section that controls the condensing-point position adjustment section so as to maintain the position of the light condensing section in the wafer thickness direction constant;
   a laser beam moving section that moves the laser beam relatively with respect to the wafer; and
   a control-section selecting section that selects one of the first control section and the second control section in accordance with the position of the laser beam on the wafer, the laser beam being moved by the laser beam moving section.

2. The laser dicing apparatus according to claim 1, further comprising
   a region setting section that sets a region where the second control section is selected by the control-section selecting section.

3. The laser dicing apparatus according to claim 2, wherein the region set by the region setting section is a region surrounded by a peripheral end part of the wafer and a substantially concentric circle located at a predetermined distance inwardly from the peripheral end part of the wafer.

4. A dicing method of a wafer by use of a laser dicing apparatus including a laser beam radiating section that radiates a laser beam, a light condensing section that condenses the laser beam inside the wafer, and a laser beam moving section that moves the laser beam with respect to the wafer, the dicing method comprising:
   a surface information acquisition step of acquiring unevenness information of a surface of the wafer based on the laser beam radiated by the laser beam radiating section;
   an adjustment method selection step of selecting one method of a first adjustment method that adjusts a position of a condensing point of the laser beam based on the unevenness information acquired at the surface information acquisition step and a second adjustment method that maintains the position of the light condensing section in a wafer thickness direction constant, in accordance with a position of the laser beam on the wafer, the laser beam being moved by the laser beam moving section; and
   a condensing point position adjustment step of adjusting the position of the condensing point of the laser beam based on the method selected at the adjustment method selection step.

* * * * *